(12) United States Patent
Kamikawa

(10) Patent No.: US 6,495,215 B1
(45) Date of Patent: Dec. 17, 2002

(54) METHOD AND APPARATUS FOR PROCESSING SUBSTRATE

(75) Inventor: Yuji Kamikawa, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/577,617

(22) Filed: May 25, 2000

(30) Foreign Application Priority Data

May 26, 1999 (JP) ............................................. 11-146209

(51) Int. Cl.$^7$ ............................ B29C 71/04; B08B 3/10; B08B 6/00
(52) U.S. Cl. ....................... 427/541; 427/547; 427/458; 427/444; 134/1; 134/2; 134/28; 15/1.51
(58) Field of Search ................................ 427/458, 472, 427/444, 547, 548, 541, 549; 15/1.51; 134/1, 1.3, 2, 3, 26, 28, 29, 30, 902

(56) References Cited

U.S. PATENT DOCUMENTS

| | | | | |
|---|---|---|---|---|
| 1,733,082 A | * | 10/1929 | McCullough | 427/541 |
| 4,105,512 A | * | 8/1978 | Martens et al. | 204/38 A |
| 4,228,200 A | * | 10/1980 | Sander et al. | 427/47 |
| 4,588,838 A | * | 5/1986 | Byrd | 546/14 |
| 4,872,946 A | * | 10/1989 | Uesugi et al. | 156/637 |
| 5,370,965 A | * | 12/1994 | Kondo et al. | 430/176 |
| 5,384,166 A | * | 1/1995 | Sato et al. | 427/547 |
| 5,405,367 A | * | 4/1995 | Schulman et al. | 607/61 |
| 5,463,952 A | * | 11/1995 | Kawasumi et al. | 205/921 |
| 5,547,518 A | * | 8/1996 | Johnson et al. | 134/2 |
| 5,807,659 A | * | 9/1998 | Nishimiya et al. | 430/302 |
| 6,012,472 A | | 1/2000 | Leenaars et al. | 134/137 |
| 6,071,674 A | * | 6/2000 | Hattori | 430/278.1 |
| 6,273,099 B1 | * | 8/2001 | Chang et al. | 134/1.3 |
| 6,284,055 B1 | * | 9/2001 | Dryer et al. | 134/10 |
| 6,299,696 B2 | * | 10/2001 | Kamikawa et al. | 134/2 |
| 6,318,386 B1 | * | 11/2001 | Kamikawa et al. | 134/902 |
| 6,319,329 B1 | * | 11/2001 | Kamikawa et al. | 134/2 |
| 6,328,905 B1 | * | 12/2001 | Lebowitz et al. | 134/1.1 |
| 2001/0007259 A1 | * | 7/2001 | Nakashima et al. | 134/902 |
| 2001/0017142 A1 | * | 8/2001 | Suzuki | 134/1 |

FOREIGN PATENT DOCUMENTS

| | | |
|---|---|---|
| JP | 12-291128 | 11/1990 |
| JP | 3-169013 | 7/1991 |
| JP | 6-103686 | 12/1994 |

\* cited by examiner

Primary Examiner—Marianne Padgett
(74) Attorney, Agent, or Firm—Smith, Gambrell & Russell, LLP

(57) ABSTRACT

A substrate processing method and a substrate processing apparatus are provided to remove a processing liquid from a substrate without using an organic solvent. Upon completion of liquid treatment to dip the substrate W in the processing liquid 30, when exposing a substrate W out of a processing liquid 30 for its removal, the liquid 30 is subjected to an electric field to generate an electric current on the liquid surface and also a magnetic field B. With the arrangement of the electric field and the magnetic field, an electromagnetic force F is produced and applied on the liquid 30 in a direction to leave from a surface of the substrate W.

19 Claims, 5 Drawing Sheets

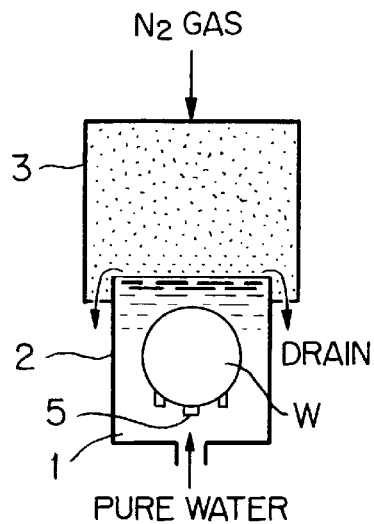
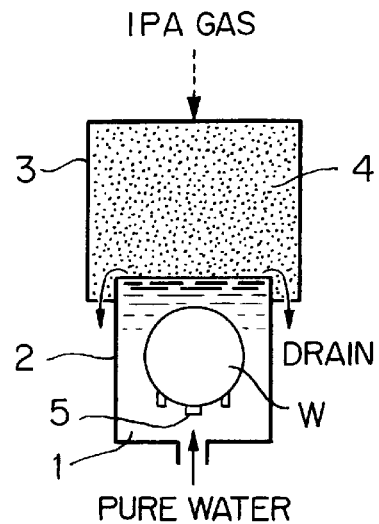
FIG. 10A  FIG. 10B
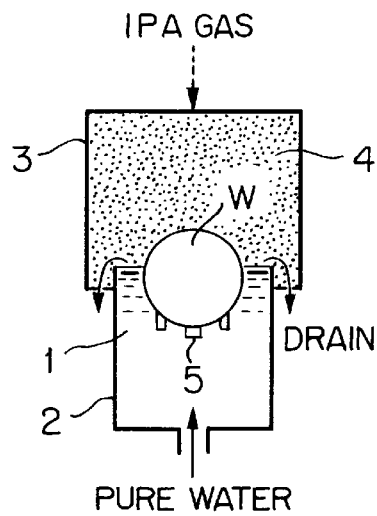
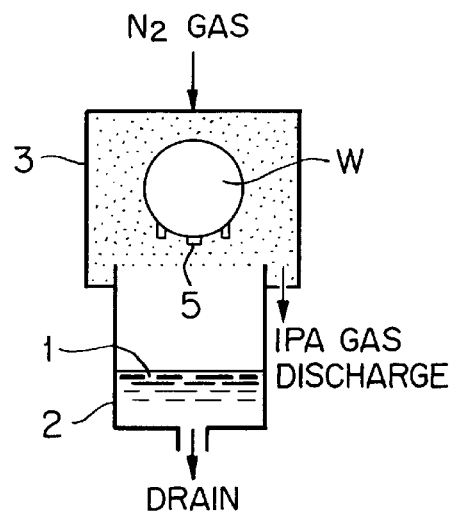
FIG. 10C  FIG. 10D
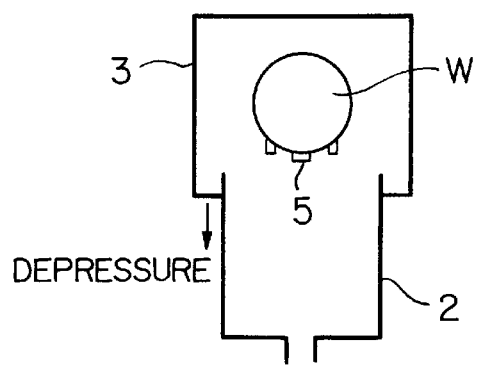
FIG. 10E

METHOD AND APPARATUS FOR PROCESSING SUBSTRATE

BACKGROUND OF THE INVENTION

1. Technical Field of the Invention

The present invention relates to substrate processing method and apparatus for cleaning substrates to be processed, for example, semiconductor wafers, LCD glass substrates, etc. by immersing the substrates in cleaning liquids, e.g. chemicals, rinsing liquids, etc. and subsequently drying the cleaned substrates.

2. Description of the Related Art

Generally, in the manufacturing process of semiconductor devices, there is a widely-adopted cleaning method by which the substrates to be processed, for example, the semiconductor wafers, the LCD glass substrates, etc. (called "wafers etc." hereinafter) are successively immersed in a cleaning bath filled up with a processing liquid, for example, the chemical, the rinsing liquid, or the like.

Further, such a cleaning apparatus is equipped with a drying unit which exposes the surfaces of the cleaned wafers etc. to dry gas of volatile organic solvent, such as IPA (isopropyl alcohol). In this unit, the vapor of dry gas is condensed or absorbed on the waters' surfaces so that the moisture can be removed from the wafers etc.

As the conventional cleaning and drying apparatus of this kind, there is a known cleaning/drying apparatus which includes a cleaning bath (cleaning chamber), a drying section and moving means, for example, a wafer boat. In this apparatus, the cleaning bath stores and accommodates the rinsing liquid (cleaning liquid), for example, the chemical of hydrofluoric acid, pure water, etc. in order to immerse the substrates, such as semiconductor wafers W, in the stored liquid. The drying section is positioned above the cleaning bath. The wafer boat carries the plural number (e.g. 50 pcs.) of wafers W to bring them to the interior of the cleaning bath and the drying section.

While, as the conventional drying method, there are known techniques disclosed in Japanese Unexamined Patent Publication (kokai) No. 2-291128 and Japanese Examined Patent Publication (kokoku) No. 6-103686.

In the publications, the drying technique disclosed in Japanese Unexamined Patent Publication (kokai) No. 2-291128 is embodied in a process flow shown in FIGS. 10A–10E. That is, wafers W are firstly dipped in a treatment bath 2 overflowing with cleaning liquid, for example, pure water. During the immersion, inert gas, such as $N_2$ gas, is charged into a processing chamber 3 for atmospheric interchange (FIG. 10A).

Next, dry gas 4 of volatile solvent vapor, such as IPA (isopropyl alcohol), is charged into the processing chamber 3 to form an IPA membrane on the surface of pure water (FIG. 10B). Then, the wafers W are pulled up from the treatment bath 2 into the processing chamber 3 by wafer carrying means, for example, a wafer boat 5.

Consequently, the withdrawn wafers W are brought into contact with the IPA gas and therefore, owing to the Marangoni's effect (difference in surface tension), the vapor of dry gas 4 is condensed or absorbed on the waters' surfaces to remove moisture from the wafers W for dry (FIG. 10C). Thereafter, N2 gas is supplied into the processing chamber 3 for removal of IPA gas in the chamber 3 (FIG. 10D) and furthermore, the interior of the processing chamber 3 is depressurized to progress the evaporation of residual moisture and IPA adhering to respective grooves of the wafer boat 5, completing the drying process (FIG. 10E).

As mentioned above, according to the conventional drying method of this kind, the removal of moisture on wafers and sequential drying are completed by the following steps of: dipping the wafers in the pure water for cleaning; moving the wafers and the pure water relatively thereby to allow the IPA membrane on the pure water surface and dry gas (IPA gas) to contact with the wafers' surfaces; and condensing or absorbing the vapor of dry gas.

In the above drying method using the vapor of volatile organic solvent, such as IPA (isopropyl alcohol), it is preferable in aspect of drying effectiveness. However, it is troublesome to discharge or drain the organic solvent while causing the undesirable situation against the environment. Additionally, in order to ensure the safety, it is necessary that the processing apparatus is equipped with a $CO_2$ extinguisher or the like.

Further, in the moisture removing method utilizing the Marangoni's effect (difference in surface tension), the drying efficiency is not satisfactory so much.

SUMMARY OF THE INVENTION

Accordingly, it is therefore an object of the present invention to provide a substrate processing method and a substrate processing apparatus, by which it is possible to remove the processing liquid from the substrate without using such an organic solvent, appropriately.

The first feature of the invention resides in a substrate processing method for processing a substrate, comprising the steps of: immersing the substrate in processing liquid; and exposing the substrate out of the processing liquid, while the processing liquid is subjected to both electric field and magnetic field in order to apply an electromagnetic force to the processing liquid; whereby the processing liquid is removed from the surface of the substrate.

That is, the present invention provides the substrate processing method utilizing the electromagnetic force (Lorentz's force) brought by the formation of both magnetic field and flow of electric current in the vicinity of the water surface, the method being different from the conventional substrate processing method, for example, the conventional cleaning/drying method. With the adoption of the "surface-dry" system without using any organic solvent, the present invention has merits to facilitate the handling of the substrate processing apparatus employing the above system and reduce the number of particles sticking to the substrate.

The second feature of the invention resides in that the processing liquid is subjected to the electric field and the magnetic field so that the resultant electromagnetic force has a downward component.

It is supposed that, for example, if drawing up the semiconductor wafer W (as the substrate) from the cleaning chamber (as the processing chamber) to the drying chamber, then the cleaning liquid (as the processing liquid) adheres to the substrate's (wafer W) surface up to its portion somewhat higher than the level of the cleaning liquid due to the inherent surface tension, as shown in FIG. 3. Therefore, when the downward electromagnetic force F is applied perpendicularly or obliquely to the surface of the cleaning liquid by the adoption of magnetic field B and current I of FIG. 3, it is possible to eliminate the cleaning liquid adhering to the surfaces of the substrate effectively.

The third feature of the invention resides in that the processing liquid is subjected to the electric field and the magnetic field so that the resultant electromagnetic force has a downward component and horizontal component which directs from a reverse face to a pattern face of the substrate.

Thus, it is possible to give the processing liquid adhering to the substrate's pattern face a force in a direction to separate the liquid from the face thereby to perform the removal of the processing liquid effectively.

The fourth feature of the invention resides in that the processing liquid is subjected to the electric field and the magnetic field so that the direction of the resultant electromagnetic force is changed as the substrate moves in relative to the surface of the processing liquid.

Therefore, in spite of irregularities on the substrate's surface, it is possible to vary an operative direction of the electromagnetic force in accordance with the profile of the substrate's surface, accomplishing the removal of the processing liquid sufficiently.

The fifth feature of the invention is bringing gas which ionizes the processing liquid to facilitate the flowing of an electric current therein into contact with the processing liquid.

Thus, in spite of pure water as the processing liquid, it is possible to provide the pure water with fine conductivity, so that the electromagnetic force can be produced more effectively.

The sixth feature of the invention resides in that the above gas contains either $CO_2$ gas or mixed gas of $CO_2$ and $N_2$.

The seventh feature of the invention resides in that at least one of magnitude of the electric field and magnitude of the magnetic field is changed so as to vary the resultant electromagnetic force.

According to the feature, the variation in magnitude of the downward electromagnetic force allows the processing liquid to be vibrated to eliminate the processing liquid effectively.

The eighth feature of the invention resides in that the electric filed and the magnetic field are synchronized so as to produce the electromagnetic force in a regular direction. This feature allows pulsating currents or alternating currents to be employed for respective sources for electrical field and magnetic field.

The ninth feature of the invention resides in that warm water is employed as the processing liquid.

The tenth feature of the invention resides in that the substrate is coated with an protective oxidation film in the immersing step. Thus, owing to the positive formation of protective oxidation film on the substrate before the drying process, it is possible to protect the substrate from the subsequent drying process etc.

The eleventh feature of the invention resides in that before forming the protective oxidation film on the substrate, the substrate is subjected to a chemical process using hydrofluoric acid to removing the natural oxidation film which should be removed.

It is noted that the surface of the wafer, of which natural oxidation film has been already eliminated, is so activated that a natural oxidation film is easy to be formed on the surface. Nevertheless, according to the eleventh feature, since the substrate is positively coated with a clean protective oxidation film after deleting the previous natural oxidation film, it is possible to restrict the formation of the natural oxidation film.

The $12^{th}$ feature of the invention resides in the substrate processing apparatus for processing a substrate, comprising: a processing bath for storing a processing liquid in which the substrate is to be processed;

exposure means for exposing the substrate out of the processing liquid in the processing bath; electrodes arranged in the vicinity of a surface of the processing liquid stored in the processing bath for generating an electric current in the processing liquid in the processing bath; and magnetic poles arranged for generating a magnetic field in a direction different from the flowing direction of the electric current.

The $13^{th}$ feature of the invention resides in that the magnetic poles each include a core and a magnetic coil wound about the core and also connected to an alternating current power source, while the electrodes are also connected to an alternating current power source.

With the above-mentioned constitution, when drawing up the substrate out of the processing chamber, there is produced a force between the surface of the substrate and processing liquid, which causes the processing liquid to adhere to the substrate due to the surface tension. This force is restricted by the downward electromagnetic force (i.e. Lorentz's force) produced by the electrode plates and the electromagnetic coils. Thus, the above force is weakened in appearance to complete the appropriate removal and drying. Owing to the adoption of the "surface-dry" system without using any organic solvent, the present invention has merits to facilitate the handling of the apparatus and reduce the number of particles sticking to the substrate.

The $14^{th}$ feature of the invention resides in that the exposure means includes a moving mechanism for moving the substrate from the processing bath upward while carrying the substrate. Additionally, the $15^{th}$ feature of the invention resides in that the exposure means includes a drain port formed in the bottom of the processing bath, a drain pipe connected to the drain port and an opening-closing valve interposed in the drain pipe. Thus, any element would be applicable to the exposure means if only it can move the substrate in relation to the surface of the processing liquid.

The $16^{th}$ feature of the invention resides in that the electrodes and the magnetic poles are arranged so that an electromagnetic force generated in the processing liquid by the electric current and the magnetic field possesses a downward component.

It is supposed that, for example, if drawing up the substrate from the cleaning chamber to the drying chamber, then the cleaning liquid adheres to the substrate's surface up to its portion somewhat higher than the level of the cleaning liquid due to the inherent surface tension. Therefore, when the downward electromagnetic force is applied perpendicularly or obliquely to the surface of the cleaning liquid, it is possible to eliminate the cleaning liquid adhering to the surfaces of the substrate effectively.

The $17^{th}$ feature of the invention resides in that the electrodes include a pair of electrode parts which are arranged in the processing bath so as to oppose each other in the vicinity of a surface of the processing liquid stored in the processing bath; the magnetic poles include a pair of magnetic pole parts which are arranged so as to oppose each other in the vicinity of a surface of the processing liquid stored in the processing bath; and the opposing direction of the electrode part s in pairs a nd the opposing direction of the magnetic pole parts in pairs intersect with each other.

Accordingly, it is possible to exert the downward electromagnetic f orce on the surface of the processing liquid, accomplishing the removal of the liquid from the surface effectively.

The $18^{th}$ feature of the invention resides in that the electrodes include a pair of electrode parts which are arranged in the processing bath so as to oppose each other in the vicinity of a surface of the processing liquid stored in the processing bath; the magnetic poles include a pair of magnetic pole parts which are arranged so as to oppose each other and also arranged so that the opposing direction of the magnetic pole parts intersects with the opposing direction of the electrode parts; and the magnetic poles are arranged so that the magnetic polar parts can occupy an optional rotating position around the opposing direction of the electrode parts, as a rotational axis.

Therefore, it is possible to rotate the direction of the magnetic field around the opposing direction of the pair of electrodes, as the rotational axis.

The 19$^{th}$ feature of the invention resides in that the substrate processing apparatus of the above 12$^{th}$ feature further comprises a pipe for supplying the processing liquid into the processing bath and at least either one of ozone water generating means interposed in the pipe, for generating ozone water and water heating means interposed in the pipe, for heating water to be a warm water.

According to the constitution, it is possible to form a clean oxidation film on the substrate easily and positively before drawing up the substrate.

The 20$^{th}$ feature of the invention resides in that the substrate processing apparatus of the above 12$^{th}$ feature further comprises a cover which closely surrounds the upside of the processing bath thereby to define a drying chamber above the processing bath and that the drying chamber is provided, at an interior thereof, with a gas supply port which is connected to a gas supply source.

The above constitution allows either $CO_2$ gas or the mixture of $CO_2$ and $N_2$ to be supplied to the processing liquid, so that it can be ionized to facilitate the formation of electric current or liquid flow.

The above and other features and advantages of this invention will become apparent, and the invention itself will best be understood, from a study of the following description and appended claims, with reference had to the attached drawings showing preferred embodiments of the invention.

BRIEF DESCRIPTION OF THE DRAWINGS

FIGS. 10A, 10B, 10C, 10D and FIG. 10E respectively show successive steps in the cleaning and drying method.

DESCRIPTION OF THE PREFERRED EMBODIMENT

Embodiments of the present invention will be described in detail on the ground of FIGS. 1 to 9.

According to the embodiment, the present invention is applied to a cleaning and drying apparatus for semiconductor wafers.

Figure 1:
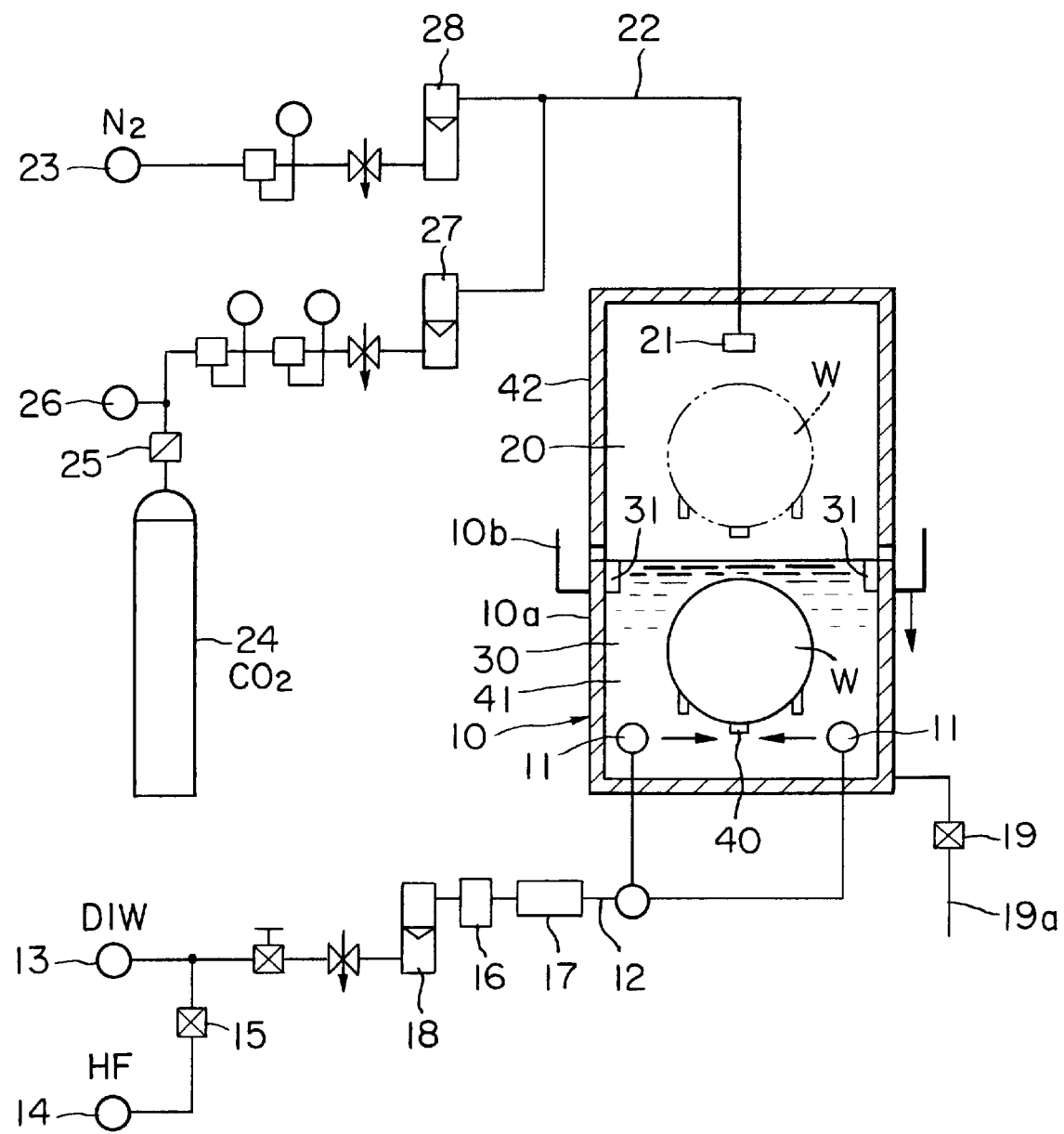
FIG. 1 is a schematic view showing the constitution of a substrate processing system to which the present invention is applied.

FIG. 1 is a schematic view showing the systematic constitution of a cleaning/drying apparatus where the substrate processing method and apparatus of the present invention are embodied.

In FIG. 1, the cleaning/drying apparatus mainly includes a processing chamber 41, a drying chamber 20 and a moving mechanism (exposure means) for handling the semiconductor wafers. In these elements, the processing chamber 41 is defined by a processing bath 10 provided for dipping semiconductor wafers W as the substrates to be processed in chemicals (e.g. hydrofluoric acid), rinsing liquids (e.g. pure water), etc. stored in the bath 10. Note, the semiconductor wafers W may be simply referred "wafers W", hereinafter. The drying chamber 20 is arranged above the processing bath 10 and covered with a casing 42. The moving mechanism allows the wafers W to be carried in batches (e.g. fifty wafers) and further moved into the processing bath 10 and the drying chamber 20. In the shown embodiment, the moving mechanism includes an elevating unit including a wafer boat 40.

The processing bath 10 is made from anticorrosion and chemical resistant materials, for example, a silica member, polypropylene, etc. and comprises an inner bath 10a and an outer bath 10b arranged outside the upper end of the inner bath 10a to receive the overflowing cleaning liquid. In the processing bath 10, chemical/cleaning liquid supplying nozzles 11 (referred "liquid supply nozzles" below) are arranged on both sides of the lower part of the bath 10, for supplying the chemical or the cleaning liquid to the wafers W in the bath 10. The liquid supply nozzles 11 are connected to a chemical source 14 and a pure water source 13 through a pipe 12 and a switching valve 15. Thus, corresponding to the operation of the switching valve 15, either chemical or pure water is supplied from the chemical source 14 or the pure water source 13 into the processing bath 10 for reservoir. Further, "halogen lamp" type heating means (heater) 16 for producing warm water and "ultraviolet irradiation" type ozone water generating means (ozonator) 17 for forming oxidation film positively are interposed in the pipe 12. Note, reference numeral 18 designates a flow meter.

Provided at the center of the processing bath 10 on its bottom part is a notshown shown drain port to which a drain pipe 19a is connected through a drain valve 19. These elements, i.e. the drain port, the drain pipe and the valve constitute the exposure means for allowing the wafers W to be exposed from the processing liquid in the processing chamber.

Similarly to the above-mentioned processing bath 10, the drying chamber 20 is made from anticorrosion and chemical resistant materials, for example, a silica member. Upside the interior of the drying chamber 20, a gas diffuser nozzle 21 is provided for preventing the disturbance on the surface of the liquid owing to its wind pressure. The gas diffuser nozzle 21 is connected to a $N_2$-gas source 23 and a $CO_2$ source 24. As other elements, there are a manual valve 25, a high-pressure gauge 26 and respective flow meters 27, 28 provided in this system.

Figure 2:
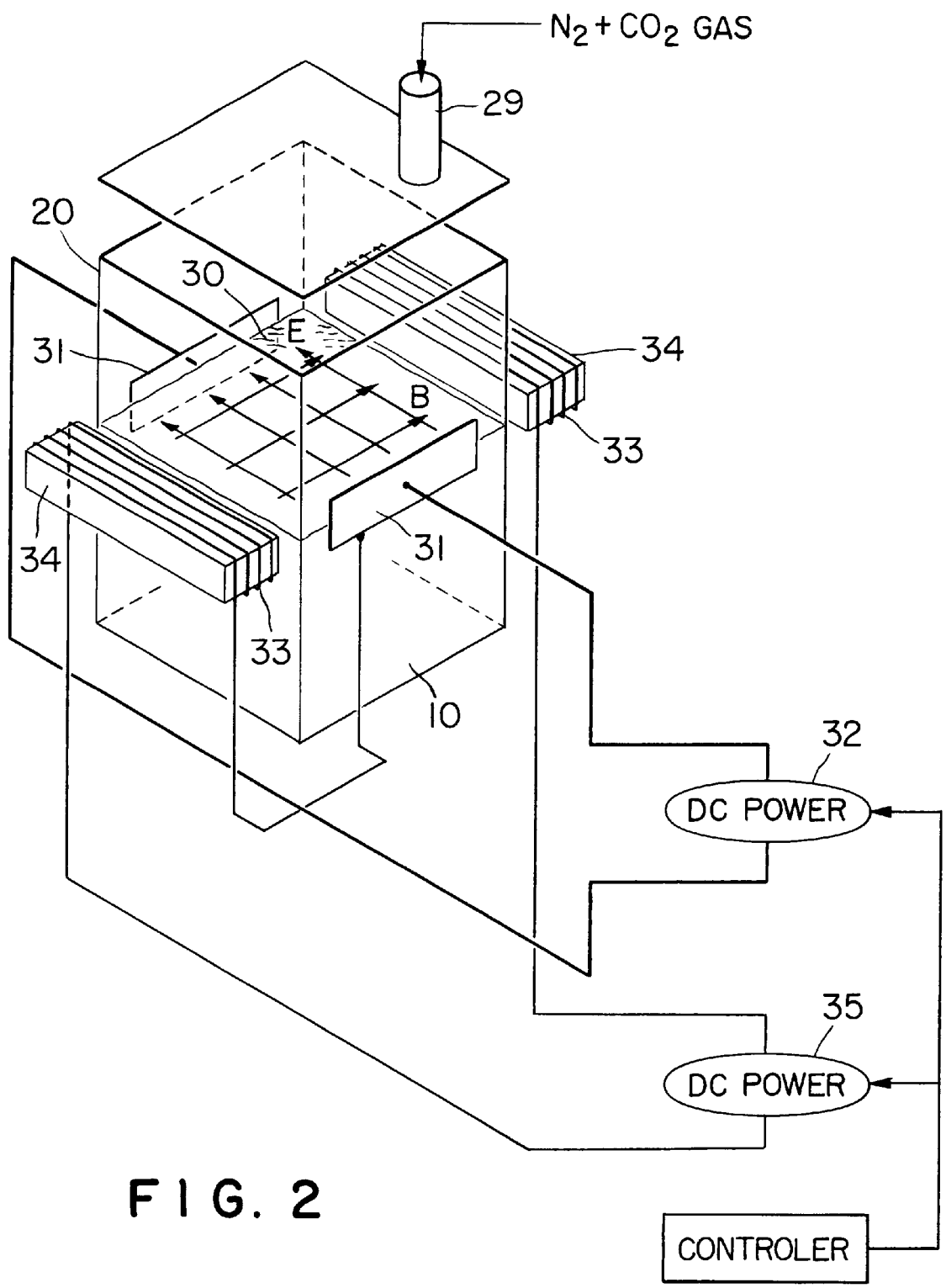
FIG. 2 is a perspective view showing a processing apparatus in accordance with the first embodiment of the present invention.

For generation of the "Lorentz's force" essential to the invention, as shown in FIG. 2, a pair of opposing electrode plates 31 are arranged in the vicinity of the opening of the processing bath 10, for allowing a direct current to flow in the cleaning liquid 30 horizontally. Both of the electrode plates 31 are connected to a first DC (direct current) power source 32. Consequently, the stream of processing liquid is generated together with the flowing of an electrical current from the positive electrode toward the negative electrode. The stream of liquid is accelerated on the surface of the liquid especially. Also arranged in the vicinity of the opening of the processing bath 10 are a pair of opposing magnetic poles which generate a magnetic field in a direction perpendicular to the direct current thereby to exert a downward electromagnetic force on the surface of the cleaning liquid 30. In the embodiment, for example, electromagnetic coils 33 and cores 34 in pairs are employed as the opposing magnetic poles. The pair of electromagnetic coils 33 are electrically connected to a second DC power source 35 in series so as to provide the N-pole at one electromagnetic coil 33 and the S-pole at another electromagnetic coil 33.

Figure 3:
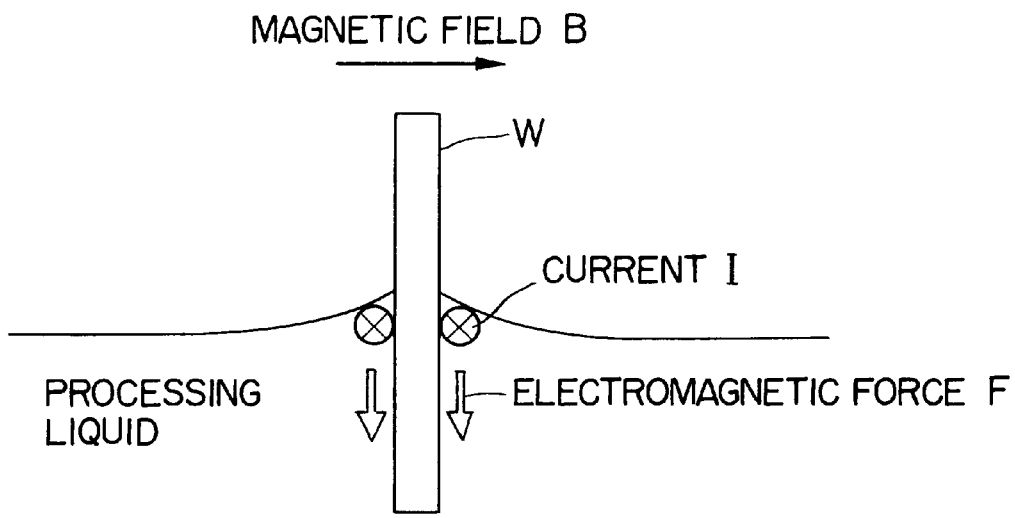
FIG. 3 is a view showing the principle of removing the processing liquid.

Since an electric field E generated by the electrode plates 31 crosses a magnetic field B generated by the electromagnetic coils 33 at right angles in the surface of the cleaning liquid 30, the downward electromagnetic force (Lorentz's force) is produced against the surface of the cleaning liquid 30 owing to the Fleming's left hand rule, as shown in FIG. 3. Thus, when drawing up the wafers W, the resultant electromagnetic force acts in a direction to reduce an adhesive force between the wafers W and the cleaning liquid 30.

Next, we describe one example of the operation of the above cleaning/drying apparatus.

First, upon moving the wafers W into the processing bath 10, the switching valve 15 is turned to the side of the chemical source 14 so that the chemical overflows the processing bath 10. In this way, the HF (hydrofluoric acid) solution is supplied to the wafers W in the processing bath 10 to perform the chemical treatment.

Next, upon draining the chemical used in the chemical treatment, the switching valve 15 is turned to the side of the pure water source 13 to somewhat overflow the processing bath 10 with the cleaning liquid, for example, pure water. In this way, the cleaning process after the chemical treatment is accomplished.

After completing the cleaning process, the ozone water generating means 17 is operated to supply the ozone water to the wafers W for the purpose of positive formation of clean oxidation films thereon. Thereafter, the heating means 16 is operated to heat the pure water to be warm water.

Under the following conditions, there are subsequently carried out steps of: drawing up the wafers W from the pure water slowly; generating the electromagnetic force with downward components in the pure water on the wafers' surfaces; and forcibly lowering the pure water being apt to be drawn up with the wafers W thereby to separate the pure water from the wafers W.

First, under condition of the overflowing of a little pure water, either $CO_2$ gas or the mixture of $CO_2$ and $N_2$ is supplied from a supply port 29 to the pure water via the gas diffuser nozzle 21. Note, the supply port 29 is formed in the top face of the drying chamber 20. With this supply, the pure water is ionized, so that the relative resistance of pure water close to the surface is lowered to facilitate the electric current's flowing.

Note, instead of providing the $CO_2$ gas to the surface of the pure water, it is possible to provide atomized pure water in which $CO_2$ is dissolved to the surface of the pure water in the processing bath in order to form a surface layer where electrical resistance of the water is low.

In this state, the electrode plates 31 in pairs are activated by the connection with the first DC power source 32. Owing to the formation of electrical field by the electrode plates 31, a faint current I and the accompanied water stream (liquid flow) do flow in the outermost layer having a reduced relative resistance of the pure water to one direction along the water surface, as shown in FIG. 3.

Further, the pair of electromagnetic coils 33 are activated by the connection with the second DC power source 35. Owing to these electromagnetic coils 33, magnetic flux B is generated in the outermost layer of the pure water in a direction perpendicular to the current I, as shown in FIG. 3. As the result of integration of both actions of the above current I and the flux B, the downward electromagnetic force acting on the outermost layer of the pure water is produced by the Fleming's left hand rule.

Under the above-mentioned condition, the wafers W once dipped into the pure water are drawn up to the side of the drying chamber 20 at a low speed. Normally, it would be expected that when the wafers W are drawn up from the pure water, then it begins to adhere to the wafers' surfaces due to the surface tension, causing the pure water to adhere to the wafers W to their heights exceeding the pure water's level. While, according to the invention, since the outermost layer of the pure water is subjected to the downward electromagnetic force of the Fleming's left hand rule by the electric current (electron) passing through the magnetic field, water molecules adjacent to the wafers W are pulled downward. At this time, owing to the generation of the Marangoni's effect, there can be obtained the wafers' surfaces on which the pure water is eliminated in the surfaces' portions above the surface of the pure water.

Consequently, no pure water is remained on the surfaces of the wafers W Note, in order to accomplish this removal of pure water completely, the supply of $N_2$ gas only via the supply port 29 is initiated at a point of time of the completion of the above pickup operation. Thus, owing to the blowing of hot $N_2$ gas, the moisture can be completely eliminated from the wafers W in the drying process.

In this way, owing to the steps to once dip the wafers W on the completion of cleaning process in the rinsing layer of the pure water and subsequently draw up them from the pure water at a low speed, the cleaning/drying apparatus of the invention is capable of attaining such a situation where no droplet is left on the wafers' surfaces. Noted repeatedly, the moisture is completely eliminated from the wafers W by the above-mentioned "hot-$N_2$ blowing" at a point of time of the completion of drawing-up.

In summary, the cleaning/drying method of the embodiment is characterized by reducing the adhering force acting between the wafers W and the cleaning liquid 30 at the time of drawing up the wafers W from the cleaning liquid 30 since the downward electromagnetic force is exerted on the surface of the cleaning liquid 30 by flowing the direct current in the cleaning liquid 30 horizontally and also applying the magnetic field on the liquid 30 vertically when drawing up the wafers W from the processing bath 10 to the drying chamber 20 in the drying process succeeding the cleaning process to dip the wafers W in the cleaning liquid 30. Additionally, in the substrate processing apparatus which includes the processing bath 10 for storing the cleaning liquid 30 for treatment of the wafers W, the drying chamber 20 positioned above the processing bath 10 and the elevating mechanism, for example, the wafer boat 40 for drawing up the wafers W from the processing bath 10 into the drying chamber 20, the present invention is characterized by the electrode plates 31 arranged in the vicinity of the opening of the processing bath 10, for allowing the direct current to flow in the liquid 30 horizontally, and also the electromagnetic coils 33 for generating the magnetic field perpendicular to the direct current to exert the downward electromagnetic force on the surface of the liquid 30, thereby reducing the adhering force acting between the wafers W and the cleaning liquid 30 at the time of drawing up the wafers W.

The cleaning/drying method in accordance with the above embodiment is so-called "boundary drying method" where the atmosphere of IPA gas is not required in the drying chamber 20, different from the conventional method. Therefore, the present method is easy in handling and superior in terms of environmental purification.

Although the direct current power source is employed as the power for activating the electrode plates 31 and the electromagnetic coils 33 in the above-mentioned embodiment, a power source having variable magnitude, for example, an alternating power source may be employed in the modification. In this case, the alternating power source may be supplied to either one of the electrode plates 31 and the electromagnetic coils 33 or supplied to both of them. Then, it should be noted to arrange the electrode plates 31 and the electromagnetic coils 33 and synchronize the alternating power sources so that the resultant electromagnetic force orientates to a desired regular direction, for example, downward in this embodiment. With the above-mentioned structure, it is possible to change the magnitude of electromagnetic force applied on the pure water with its acceleration. In other words, just like generating an impact, it is possible to remove the pure water from the wafers W forcefully.

Here, although the Lorentz's force is applied in a direction perpendicular to the surface of the cleaning liquid in the above-mentioned embodiment, the direction of magnetic field may be somewhat modified so that the electromagnetic force acts obliquely downward to the surface of the cleaning liquid.

We now describe some embodiments in the above-mentioned case.

Figure 4:
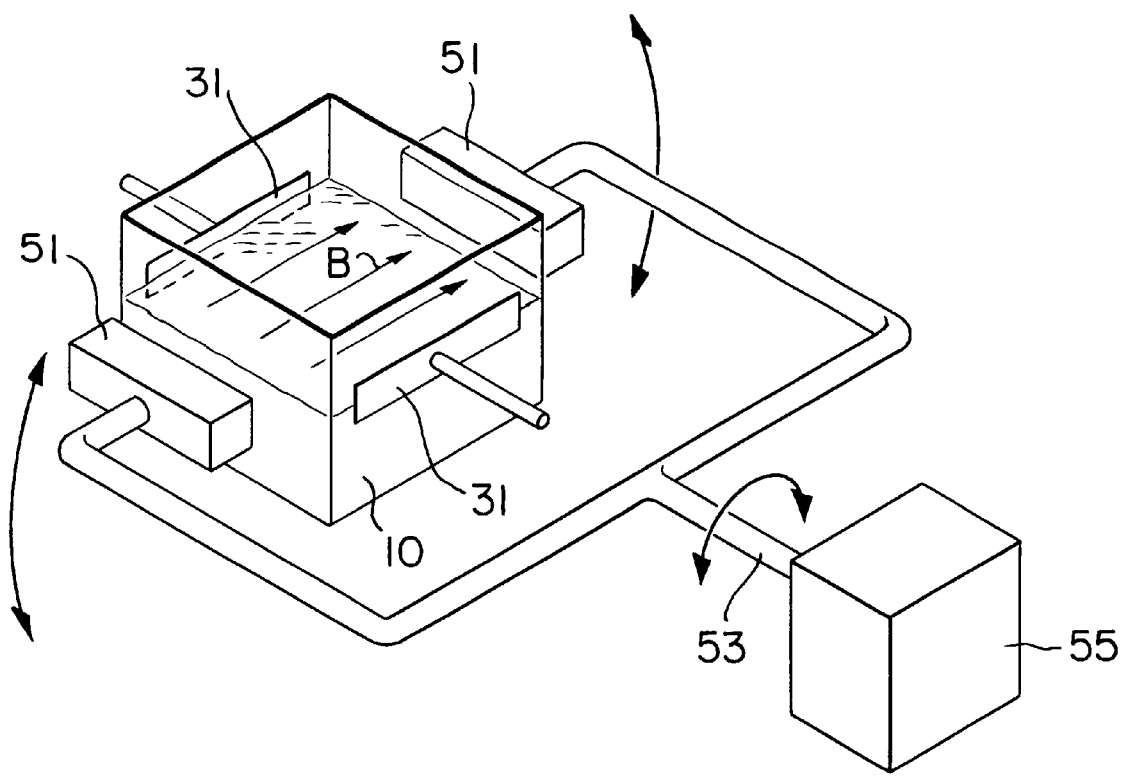
FIG. 4 is a perspective view showing the processing apparatus in accordance with the second embodiment of the present invention.

FIG. 4 shows the second embodiment of the invention. In this cleaning/drying apparatus, a pair of magnetic poles 51, 51 that oppose each other on both sides of the processing bath 10 are supported by a carrying arm 53. The carrying arm 53 is rotatably held by a rotating device 55. With this arrangement, the magnetic poles 52, 52 are adapted so as to be rotatable in a plane perpendicular to the opposing direction of the electrodes 31, 31 in pairs. That is, according to the embodiment, it is possible to establish the electromagnetic force (i.e. Lorentz's force) directing to a desired direction by changing a direction of the magnetic field B formed by the opposing magnetic poles 51, 51.

The detailed processing method while using the cleaning/drying apparatus will be explained below.

Figure 5:
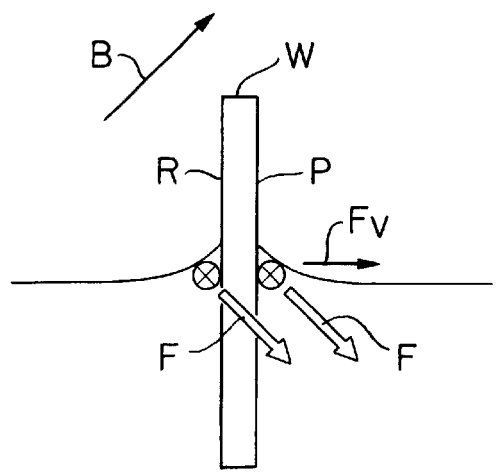
FIG. 5 is a view showing a condition to apply an electromagnetic force obliquely downward.

FIG. 5 shows the establishment of the magnetic field B that directs obliquely upward. With such an establishment, it is possible to produce the electromagnetic force F which is apt to direct downward in accordance with a direction extending from a reverse face R of the wafer W to a pattern face P. Consequently, since a force Fv is produced in a direction perpendicular to the substrate as a divisional force of the electromagnetic force F, the force Fv allows the processing liquid to be separated from the pattern face P forcibly, accomplishing the promotion of the drying operation.

Figure 6:
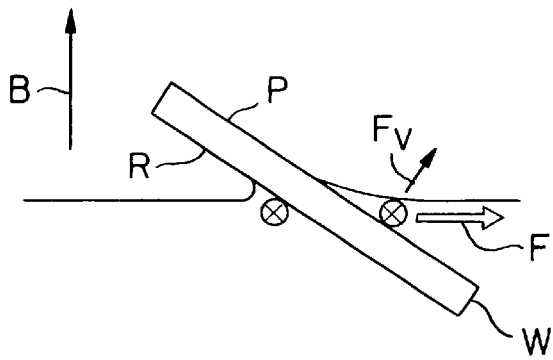
FIG. 6 is a view showing a condition to apply the horizontal electromagnetic force on the processing liquid about the wafer in its oblique arrangement.

FIG. 6 shows the wafer W arranged obliquely to the liquid surface on the establishment of the magnetic field B directing upward. In this case, the electromagnetic force F acts in the horizontal direction and therefore, the divisional force Fv perpendicular to the substrate acts in a direction apart from the pattern face P of the wafer W Thus, also in this case, it is possible to separate the processing liquid from the pattern face P forcibly, accomplishing the promotion of the drying operation.

Figure 7:
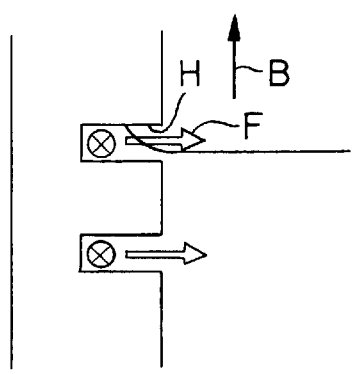
FIG. 7 is a view showing a condition to arrange the wafer having holes vertically and apply the electromagnetic force on the wafer horizontally.

FIG. 7 shows the wafer W on which holes H are formed. Then, the wafer W is arranged uprightly to the liquid surface on the establishment of the magnetic field B directing vertically upward. As a result, the arrangement of the wafer B and the field B allows the electromagnetic force F to act to the horizontal direction identical to the formation of the holes H. Thus, it is possible to withdraw the processing liquid from the bottoms of the holes H, improving the drying operation.

Figure 8:
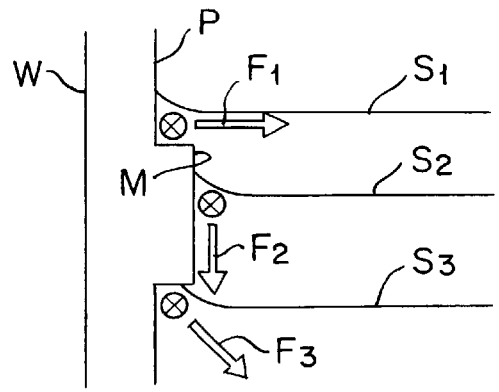
FIG. 8 is a view showing a condition to arrange the stepped wafer vertically and further change the direction of electromagnetic force being applied on the wafer, as the liquid level does drop.

FIG. 8 shows the substrate to be processed W has a projection M formed on the processing face P, in the vertical arrangement. In this case, as the liquid surface descends from the level $S_1$ to the levels $S_2$, $S_3$ with the pickup of the wafer W, the direction of the magnetic field B is changed so that the resultant electromagnetic force F turns its direction from the arrow $F_1$ to the arrows $F_2$, $F_3$, respectively. In detail, when the liquid surface is positioned somewhat higher (i.e. level $S_1$) than the upper end of the projection M, the electromagnetic force is orientated in the horizontal direction ($F_1$). Similarly, when the liquid surface is positioned on the side face of the projection M (i.e. level $S_2$), the electromagnetic force is orientated vertically downward ($F_2$). When the liquid surface comes into contact with the lowermost face of the projection M (i.e. level $S_3$), the electromagnetic force is orientated obliquely downward ($F_3$). In this way, it is possible to separate the processing liquid from the projection M effectively.

Figure 9:
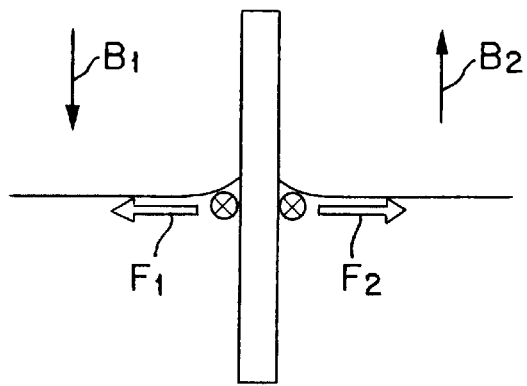
FIG. 9 is a view showing a condition to apply the electromagnetic force on both side faces of the vertically-arranged wafer in the horizontal and opposite directions.

FIG. 9 shows magnetic fields $B_1$, $B_2$ in the vertically opposite directions, which are produced on both sides of the wafer W in the vertical arrangement, owing to the provision of magnetic poles in two pairs. Consequently, on both sides of the wafer W, the electromagnetic forces $F_1$, $F_2$ are generated in directions to separate the processing liquid from the wafer's surfaces, so that the processing liquid can be separated from the wafers' surfaces effectively.

Note, although the above-mentioned embodiments have been described by example of the cleaning/drying process of "batch" type, the present invention is not only limited to the above cleaning/drying process but cleaning/drying process and apparatus directed to process a single wafer.

As mentioned above, in the substrate processing method of dipping the substrate into the processing liquid stored in the processing chamber and subsequently exposing the substrate out of the processing liquid, the surface of the processing liquid is subjected to both electric field and magnetic field perpendicular to the electric field, so that the electromagnetic force is applied to the processing liquid for its removal from the surface of the substrate. Further, according to the invention, the substrate processing apparatus includes the processing bath for storing a processing liquid for treatment of the substrate, the processing bath defining a processing chamber where the substrate is to be processed; the exposure means for exposing the substrate out of the processing liquid in the processing chamber; the electrodes arranged in the vicinity of the surface of the processing liquid stored in the processing bath to generate an electric current in the processing liquid in the processing bath; and the magnetic poles arranged in the vicinity of the surface of the processing liquid stored in the processing bath to generate the magnetic field in a direction different from the flowing direction of the electric current.

That is, when drawing up the substrate out of the processing chamber, there is produced a force between the surface of the substrate and the processing liquid, which causes the processing liquid to adhere to the substrate due to the surface tension. This force is restricted by the downward electromagnetic force (i.e. Lorentz's force) produced by the electrode plates and the electromagnetic coils. Thus, the above force is weakened in appearance to complete the appropriate removal and drying. Owing to the adoption of the "surface-dry" system without using any organic solvent, the present invention has merits to facilitate the handling of the apparatus and reduce the number of particles sticking to the substrate.

What is claimed is:

1. A substrate processing method for processing a substrate, comprising the steps of:

immersing the substrate in a processing liquid; and drawing the substrate out of the processing liquid, wherein the drawing step includes the steps of causing electric current to flow in one direction along a surface of the substrate through a surface of the processing liquid and exerting a magnetic field on the surface of the processing liquid so that the electromagnetic force caused by the electric current and the magnetic field is applied to the surface of the processing liquid to prevent the processing liquid from adhering to the surface of the substrate just after the substrate appears out of the processing liquid.

2. A substrate processing method as claimed in claim 1, wherein the processing liquid is subjected to the electric field and the magnetic field so that the resultant electromagnetic force has a downward component.

3. A substrate processing method as claimed in claim 1, wherein the processing liquid is subjected to the electric field and the magnetic field so that the resultant electromagnetic force has a downward component and a horizontal component.

4. A substrate processing method as claimed in claim 1, wherein the processing liquid is subjected to the electric field and the magnetic field so that the direction of the resultant electromagnetic force is changed as the substrate moves in relation to the surface of the processing liquid when the substrate is drawn up out of the processing liquid.

5. A substrate processing method as claimed in claim 1, further comprising a step of:

bringing gas, which ionizes the processing liquid to facilitate the flowing of an electric current therein, into contact with the processing liquid.

6. A substrate processing method as claimed in claim 5, wherein the gas contains either $CO_2$ gas or mixed gas of $CO_2$ and $N_2$.

7. A substrate processing method as claimed in claim 1, wherein at least one of a magnitude of the electric field and a magnitude of the magnetic field is changed so as to vary the resultant electromagnetic force.

8. A substrate processing method as claimed in claim 7, wherein the electric field and the magnetic field are synchronized so as to produce the electromagnetic force in a regular direction.

9. A substrate processing method as claimed in claim 1, wherein warmed water is employed as the processing liquid.

10. A substrate processing method as claimed in claim 1, wherein the substrate is coated with a protective oxidation film in the immersing step.

11. A substrate processing method as claimed in claim 10, wherein before forming the protective oxidation film on the substrate, the substrate is subjected to a chemical process using hydrofluoric acid to remove a natural oxidation film.

12. A substrate cleaning method for cleaning a substrate, comprising the steps of:

immersing the substrate in cleaning liquid;

cleaning the substrate in the cleaning liquid;

drawing the substrate out of the cleaning liquid, wherein
      during the drawing step, causing electric current flow in one direction along the surface of the substrate through a surface of the cleaning liquid, and
      exerting a magnetic field on the surface layer of the cleaning liquid so that the electromagnetic force caused by the electric current and the magnetic field is applied to the surface of the cleaning liquid to prevent the cleaning liquid from adhering to the surface of the substrate just after the substrate appears out of the cleaning liquid.

13. A substrate cleaning method as claimed in claim 12, wherein the electric current flows in the surface of the cleaning liquid and the magnetic field is exerted on the surface of the cleaning liquid so that the resultant electromagnetic force has a downward component.

14. A substrate cleaning method as claimed in claim 12, wherein the electric current flows and the magnetic field is exerted so that the resultant electromagnetic force has a downward component and a horizontal component.

15. A substrate cleaning method as claimed in claim 12, wherein the surface of the substrate is not flat, and wherein the electric current flows through the surface of the cleaning liquid, and the magnetic field is exerted on the surface of the cleaning liquid in such a way that the direction of the resultant electromagnetic force which is caused by the electric current and the magnetic field and which is applied to the surface of the cleaning liquid, is changed as the substrate moves in relation to the surface of the cleaning liquid as the substrate is drawn up out of the cleaning liquid.

16. A substrate cleaning method as claimed in claim 12, further comprising a step of:

bringing gas, which ionizes the cleaning liquid to facilitate the flowing of an electric current therein, into contact with the cleaning liquid.

17. A substrate cleaning method as claimed in claim 16, wherein the gas contains either $CO_2$ gas or mixed gas of $CO_2$ and $N_2$.

18. A substrate cleaning method as claimed in claim 12, wherein at least one of a magnitude of the electric current and a magnitude of the magnetic field is changed so as to vary the resultant electromagnetic force.

19. A substrate cleaning method as claimed in claim 18, wherein the electric current and the magnetic field are synchronized so as to produce the resultant electromagnetic force in a regular direction.

* * * * *